(12) United States Patent
Arita (10) Patent No.: US 6,291,290 B1
(45) Date of Patent: Sep. 18, 2001

(54) THIN FILM CAPACITOR WITH AN IMPROVED TOP ELECTRODE AND METHOD OF FORMING THE SAME

(75) Inventor: Koji Arita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/257,254

(22) Filed: Feb. 25, 1999

(30) Foreign Application Priority Data

Feb. 25, 1998 (JP) .................................................. 10-043296

(51) Int. Cl.$^7$ ...................................................... H01L 21/20
(52) U.S. Cl. ............................................. 438/240; 438/396
(58) Field of Search ...................................... 438/240, 396, 438/FOR 212, FOR 230

(56) References Cited

U.S. PATENT DOCUMENTS 5,185,689 * 2/1993 Maniar .
6,078,493 * 6/2000 Kang .

FOREIGN PATENT DOCUMENTS 6290984 10/1994 (JP) .
1012751 1/1998 (JP) .

* cited by examiner

Primary Examiner—George Fourson
Assistant Examiner—Thanh V Pham
(74) Attorney, Agent, or Firm—Young & Thompson (57) ABSTRACT

A method of making a top electrode for a thin film capacitor with a multi-layer structure that includes a high dielectric oxide layer, a first conductive layer on the high dielectric oxide layer and having a high formability to a reactive ion etching, and a second conductive layer on the first conductive layer, the second conductive layer having a high formability to the reactive ion etching. The first conductive layer is deposited with a lower deposition rate than the second conductive layer. An interface between the first conductive layer and the high dielectric oxide layer is such that a density of a leak current across the interface is suppressed at not higher than $1 \times 10^{-8}$ A/cm$^2$ upon applying a voltage of 2V across the dielectric oxide layer after the multi-layer structure has been subjected to a heat treatment at 350° C.

14 Claims, 6 Drawing Sheets

THIN FILM CAPACITOR WITH AN IMPROVED TOP ELECTRODE AND METHOD OF FORMING THE SAME

BACKGROUND OF THE INVENTION

The present invention relates to a thin film capacitor and a method of forming the same and more particularly to a thin film capacitor with an improved top electrode suitable for advanced semiconductor devices and advanced integrated circuits and a method of forming the same at high throughput and high yield.

As a degree of integration of semiconductor memory devices such as dynamic random access memories has been on the increase, various kinds of high dielectric oxides such as $(Ba, Sr)TiO_3$ have been actively investigated for a dielectric film of a thin film capacitor, instead of silicon dioxide or silicon nitride.

When the high dielectric oxide is used for the dielectric film of the thin film capacitor, a polysilicon electrode is not useable due to a problem with possible oxidation of an interface of the polysilicon electrode with the high dielectric oxide film, for which reason metals such as Pt, Ru and conductive metal oxides as well as conductive nitrides such as TiN have also been on the investigation for electrodes of the thin film capacitor.

The thin film capacitors having the high dieclectric oxide layer sandwiched between top and bottom electrodes have been investigated and reported mostly about improvements in capacitance characteristic and current leakage characteristics both of which are important factors for the thin film capacitors.

A prior art of the thin film capacitor was reported in *Japanese Journal of Applied Physics*, Vol. 36, No. 9B, pp. 5860–5865. The thin film capacitor has a $Pt/(Ba, Sr)TiO_3/Pt$ structure, wherein a $(Ba, Sr)TiO_3$ dielectric layer is deposited by a radio frequency magnetron sputtering method whilst Pt top and bottom electrodes are deposited by a DC sputtering method. There was investigated variations in current leakage of the thin film capacitor over deposition conditions for a second DC sputtering process for the Pt top electrode. It was confirmed that under application of a voltage of –1 V, the leakage of current at a DC power of 0.2 kW is smaller by two or three digits than at DC powers of 0.5 kW and 1.0 kW. The reason why the leakage of current is reduced is that the roughness of an interface of the top electrode with the high dielectric oxide film reduces a Schottky barrier height of the interface between the top electrode and the high dielectric oxide film.

However, prior art other than the above are directed to the high dielectric oxide layers and the bottom electrode structures whilst the prior art directed to the top electrode structure is a rare case. The bottom electrode and the high dielectric oxide layer are likely to be strongly influenced by later processes, for which reason most of the development and investigation was directed to the bottom electrode and the high dielectric oxide layer. On the other hand, the top electrode is in major cases grounded, for which reason the top electrode has received weak attention or concern.

The present inventor has investigated possible various factors of the top electrode which might provide influences to the thin film capacitor and could confirm the fact that an interface state between the high dielectric oxide layer and the top electrode provides large influences to the current leakage characteristic and the adhesion between them for the thin film capacitor.

For example, the above first prior art thin film capacitor of the $Ru/(Ba, Sr)TiO_3/Ru$ structure shows the good leakage characteristic of $1 \times 10^{-8}$ $A/cm^2$. Notwithstanding, the first prior art thin film capacitor of the $Ru/(Ba, Sr)TiO_3/Ru$ structure was placed in oxygen gas or nitrogen gas at 500° C. for 30 minutes in order to have confirmed a temperature hysteresis, whereby the leakage characteristic is deteriorated. The causes of the deterioration in the current leakage characteristic has been investigated with TEM observation and local EDX analysis and could confirm the fact that the deterioration in the current leakage characteristic is caused by both oxidation of Ru on an interface between the Ru top electrode layer and the $(Ba, Sr)TiO_3$ high dielectric oxide layer and a diffusion of Ru from the Ru top electrode layer into the $(Ba, Sr)TiO_3$ high dielectric oxide layer.

In general, the top electrode as formed receives a heat treatment such as an anneal at a temperature of not less than 350° C. for formation of interconnections extending over the thin film capacitor or a passivation film overlying the thin film capacitor, for which reason if a highly oxidizable metal or highly diffusable metal is used for the top electrode, then a thermal oxidation of the metal may appear whereby the current leakage characteristic is deteriorated.

In order to improve the leak characteristics of the thin film capacitor, it is important to prevent the thin film capacitor from a later heat treatment at a high temperature of not less than 350° C. after the thin film capacitor has been formed. It was experimentally confirmed that, under condition of a low temperature heat treatment to be carried out after the thin film capacitor has been formed, it is not problem to select highly oxidizable and diffusable metals such as Ru or Ir for the top electrode material and it is preferable to deposit such metal at a low power for prevention of any substantive deterioration in the leak characteristics of the thin film capacitor.

Meanwhile, the above second prior art shows the fact that the current leakage characteristic could be improved by two or three digits by drop of a power of the DC sputtering process for reduction in deposition rate. Table 1 on page 5860 of Japanese Journal of Applied Physics shows that in order to obtain the improvement by two or three digits of the current leakage characteristic, it is required to remarkably reduce the deposition rate of the top electrode down to about one quarter. Such remarkable reduction in deposition rate causes an undesirable reduction in throughput, whereby productivity of the thin film capacitor is thus dropped.

An adhesiveness of the second prior art thin film capacitor of the $Pt/(Ba, Sr)TiO_3/Pt$ structure was evaluated and it was confirmed that the adhesiveness of the film is lowered by drop of the power applied to the target during the DC sputtering process. Such reduction in the adhesiveness of the film increases a probability of peeling the film, whereby reliability of the semiconductor device and the yield thereof are thus reduced.

Similarly to the case of Pt, the use of other materials such as Ru, $RuO_2$, Ir and $IrO_2$ for the top electrode material also causes the same problem with drops in the deposition rate and the adhesiveness of the top electrode even the drop of the sputter power may improve the current leakage characteristics of the thin film capacitor.

In addition, Japanese laid-open patent publication No. 7-221197 addresses a Ru bottom electrode for the thin film capacitor but is silent on the structure of the top electrode.

Further, Japanese laid-open paten publication No. 8-17806 addresses a method of forming a thin film capacitor having the $Pt/(Ba, Sr)TiO_3/Pt$ structure but is silent on the structure of the top electrode and on any influence to the capacitance characteristic by use of Pt for the top electrode.

In the above circumstances, it had been required to develop a novel thin film capacitor with an improved top electrode structure which makes the thin film capacitor free from any problems and disadvantages as described above and a novel method of forming the same.

SUMMARY OF THE INVENTION

Accordingly, it is an object of the present invention to provide a novel thin film capacitor with an improved top electrode structure which makes the thin film capacitor free form any problems and disadvantages as described above.

It is further object of the present invention to provide a novel thin film capacitor with an improved top electrode structure free from the problems with oxidation of an interface of the top electrode with a high dielectric oxide layer due to a heat treatment of not higher than 350° C.

It is a further more object of the present invention to provide a novel thin film capacitor with an improved top electrode structure free from the problems with diffusion of a metal of the top electrode into a high dielectric oxide layer due to a heat treatment of not higher than 350° C.

It is a further more object of the present invention to provide a novel thin film capacitor with an improved top electrode structure which allow the thin film capacitor to keep excellent current leakage characteristic even after a heat treatment has been carried out at a temperature of not higher than 350° C.

It is still more object of the present invention to provide a novel top electrode structure on a high dielectric oxide layer of a thin film capacitor, wherein the top electrode structure makes the thin film capacitor free form any problems and disadvantages as described above.

It is moreover object of the present invention to provide a novel top electrode structure on a high dielectric oxide layer of a thin film capacitor, wherein the top electrode structure is free from the problems with oxidation of an interface of the top electrode with a high dielectric oxide layer due to a heat treatment of not higher than 350° C.

It is another object of the present invention to provide a novel top electrode structure on a high dielectric oxide layer of a thin film capacitor, wherein the top electrode structure is free from the problems with diffusion of a metal of the top electrode into a high dielectric oxide layer due to a heat treatment of not higher than 350° C.

It is still another object of the present invention to provide a novel top electrode structure on a high dielectric oxide layer of a thin film capacitor, wherein the top electrode structure allows the thin film capacitor to keep excellent current leakage characteristic even after a heat treatment has been carried out at a temperature of not higher than 350° C.

It is yet another object of the present invention to provide a novel method of forming a thin film capacitor for rising throughput of the thin film capacitor.

It is further another object of the present invention to provide a novel method of forming a thin film capacitor for improvement in adhesiveness of the films of the thin film capacitor.

It is an additional object of the present invention to provide a novel method of forming a thin film capacitor for improvement in yield of the films of the thin film capacitor.

It is a still additional object of the present invention to provide a novel method of forming a top electrode on a high electric oxide layer of a thin film capacitor for rising throughput of the thin film capacitor.

It is yet an additional object of the present invention to provide a novel method of forming a top electrode on a high electric oxide layer of a thin film capacitor for improvement in adhesiveness of the films of the thin film capacitor.

It is a further additional object of the present invention to provide a novel method of forming a top electrode on a high electric oxide layer of a thin film capacitor for improvement in yield of the films of the thin film capacitor.

It is also additional object of the present invention to provide a novel method of forming a top electrode on a high electric oxide layer of a thin film capacitor for making the thin film capacitor free from the above problems and disadvantages.

The first aspect of the present invention provides a multi-layer structure comprising: a high dielectric oxide layer; a first conductive layer on the high dielectric oxide layer, and processing a high formability to a reactive ion etching; and a second conductive layer on the first conductive layer, and the second conductive layer processing a high formability to the reactive ion etching, wherein an interface between the first conductive layer and the high dielectric oxide layer is such that a density of a leak current across the interface is suppressed at not higher that $1 \times 10^{-8}$ A/cm$^2$ upon applying a voltage of 2 V across the dielectric oxide layer after the multi-layer structure has been subjected to a heat treatment at 350° C.

The second aspect of the present invention provides a top electrode structure of a thin film capacitor, the structure comprising: a first conductive layer on a high dielectric oxide layer, and processing a high formability to a reactive ion etching; and a second conductive layer on the first conductive layer, and processing a high formability to the reactive ion etching, wherein an interface between the first conductive layer and the high dielectric oxide layer is such that a density of a leak current across the interface is suppressed at not higher that $1 \times 10^{-8}$ A/cm$^2$ upon applying a voltage of 2 V across the dielectric oxide layer after the multi-layer structure has been subjected to a heat treatment at 350° C.

The third aspect of the present invention provides a method of forming a top electrode on a high dielectric oxide layer of a thin film capacitor. The method comprises the steps of: carrying out a deposition of a conductive material having a formability to a reactive ion etching under a first deposition condition of a first deposition rate to deposit a first conductive layer on the high dielectric oxide layer; and continuing the deposition the same conductive material under a second deposition condition of a second deposition rate which is higher that the first deposition rate to deposit a second conductive layer on the first conductive layer, wherein an interface between the first conductive layer and the high dielectric oxide layer is such that a density of a leak current across the interface is suppressed at not higher than $1 \times 10^{-8}$ A/cm$^2$ upon applying a voltage of 2 V across the dielectric oxide layer after the multi-layer structure has been subjected to a heat treatment at 350° C.

The fourth aspect of the present invention provides a method of forming a top electrode on a high dielectric oxide layer of a thin film capacitor. The method comprises the steps of: carrying out a first deposition of a first conductive material having a formability to a reactive ion etching under a first deposition condition of a first deposition rate to deposit a first conductive layer on the high dielectric oxide layer; and carrying out a second deposition of a second conductive material having a formability to the reactive ion etching under a second deposition condition of a second deposition rate which is higher that the first deposition rate to deposit a second conductive layer on the first conductive layer, wherein an interface between the first conductive layer and the high dielectric oxide layer is such that a density of a leak current across the interface is suppressed at not higher than $1 \times 10^{-8}$ A/cm$^2$ upon applying a voltage of 2 V across the dielectric oxide layer after the multi-layer structure has been subjected to a heat treatment at 350° C.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

The first aspect of the present invention provides a multi-layer structure comprising: a high dielectric oxide layer; a first conductive layer on the high dielectric oxide layer, and processing a high formability to a reactive ion etching; and a second conductive layer on the first conductive layer, and the second conductive layer processing a high formability to the reactive ion etching, wherein an interface between the first conductive layer and the high dielectric oxide layer is such that a density of a leak current across the interface is suppressed at not higher than $1 \times 10^{-8}$ A/cm$^2$ upon applying a voltage of 2 V across the dielectric oxide layer after the multi-layer structure has been subjected to a heat treatment at 350° C.

The above novel thin film capacitor provides the following advantages.

First, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor.

Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

It is preferable that the first conductive layer and the second conductive layer are made of the same conductive material which includes at least any one selected from the group consisting of Ru, RuO$_2$, Ir, IrO$_2$, and alloys thereof.

It is also preferable that the first conductive layer and the second conductive layer are made of different conductive materials, each of which includes at least any one selected from the group consisting of Ru, RuO$_2$, Ir, IrO$_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is further preferable that the first conductive layer consists essentially of Ru and the second conductive layer consists essentially of Ir.

It is also preferable that the first conductive layer has a thickness of about one-tenth of the thickness of the second conductive layer. It is also preferable that the first conductive layer has a thickness of about one-tenth of a thickness of the second conductive layer. It is not essential for the present invention to limit the thickness of the first conductive layer in contact with the high dielectric oxide layer. It is, however, preferable that the first conductive layer is very thin. The thickness of the first conductive layer is preferably not more that 10 nanometers, and more preferably 5 nanometers. It is also not essential for the present invention to limit the thickness of the second conductive layer separated from the high dielectric oxide layer. It is, however, preferable that the thickness of the second conductive layer is thicker by about ten times that the first conductive layer.

The second aspect of the present invention provides a top electrode structure of a thin film capacitor, the structure comprising: a first conductive layer on a high dielectric oxide layer, and processing a high formability to a reactive ion etching; and a second conductive layer on the first conductive layer, and processing a high formability to the reactive ion etching, wherein an interface between the first conductive layer and the high dielectric oxide layer is such that a density of a leak current across the interface is suppressed at not higher that $1 \times 10^{-8}$ A/cm$^2$ upon applying a voltage of 2 V across the dielectric oxide layer after the multi-layer structure has been subjected to a heat treatment at 350° C.

The above above thin film capacitor provides the following advantages.

Fist, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor.

Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

It is preferable that the first conductive layer and the second conductive layer are made of the same conductive material which includes at least any one selected from the group consisting of Ru, $RuO_2$, Ir, $IrO_2$, and alloys thereof.

It is also referable that the first conductive layer and the second conductive layer are made of different conductive materials, each of which includes at least any one selected from the group consisting of Ru, $RuO_2$, Ir, $IrO_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is further preferable that the first conductive layer consists essentially of Ru and the second conductive layer consists essentially of Ir.

It is also referable that the first conductive layer has a thickness of about one-tenth of a thickness of the second conductive layer. It is also preferable that the first conductive layer has a thickness of about one-tenth of a thickness of the second conductive layer. It is not essential for the present invention to limit the thickness of the first conductive layer in contact with the high dielectric oxide layer. It is, however, preferable that the first conductive layer is very thin. The thickness of the first conductive layer is preferably not more that 10 nanometers, and more preferably 5 nanometers. It is also not essential for the present invention to limit the thickness of the second conductive layer separated from the high dielectric oxide layer. It is, however, preferable that the thickness of the second conductive layer is thicker by about ten times than the first conductive layer.

The third, aspect of the present invention provides a method of forming a top electrode on a high dielectric oxide layer of a thin film capacitor. The method comprises the steps of: carrying out a deposition of a conductive material having a formability to a reactive ion etching under a first deposition condition of a first deposition rate to deposit a first conductive layer on the high dielectric oxide layer; and continuing the deposition the same conductive material under a second deposition condition of a second deposition rate which is higher than the first deposition rate to deposit a second conductive layer on the first conductive layer, wherein an interface between the first conductive layer and the high dielectric oxide layer is such that a density of a leak current across the interface is suppressed at not higher than $1 \times 10^{-8}$ $A/cm^2$ upon applying a voltage of 2 V across the dielectric oxide layer after the multi-layer structure has been subjected to a heat treatment at 350° C.

The above novel thin film capacitor provides the following advantages.

First, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor, Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

It is preferable that the first conductive layer is deposited at the first deposition rate by a first sputtering process with applying a target with a first power and then the second conductive layer is deposited at the second deposition rate by a second sputtering process with applying the target with a second power which is higher than the first power.

It is also preferable that the first power is less than 1.7 $W/cm^2$, and the second power is more than 1.7 $W/cm^2$. It is not essential for the present invention to limit the power level to be applied to the sputter target, but it is preferable to apply a low power level of, for example, 1.7 $W/cm^2$ to the sputter target for a low rate deposition of the first conductive layer in contact with the high dielectric oxide layer in order to prevent the surface of the high dielectric oxide layer from receipt of any substantive damage. In this case, the thin film capacitor shows the good current leakage characteristics such that the leak current density remains suppressed at not higher than $1 \times 10^{-8}$ $A/cm^2$ under applications to the target with the driving voltage in the range of 0 V to 2 V. If, however, the sputter target is applied with a higher power lever than 1.7 $W/cm^2$ for a high rate deposition of the first conductive layer in contact with the high dielectric oxide layer in order to provide the surface of the high dielectric oxide layer from receipt of any substantive damage, then the thin film capacitor shows the undesirable current leakage characteristics such that the leak current density shows a rapid increase from $1\times10^{-8}$ A/cm$^2$ as the driving voltage to be applied to the target is increased from 1.5 V. Consequently, it is preferable that the power level applied to the sputter target for a low rate deposition of the first conductive layer in contact with the high dielectric oxide layer is suppressed at, for example, not higher than 1.7 W/cm$^2$.

Namely, it is preferable that the first voltage level applied to the target for a low rate deposition of the first conductive layer is set not higher than 1.7 W/cm$^2$, whilst the second voltage level applied to the target for a high rate deposition of the second conductive layer is set higher than 1.7 W/cm$^2$.

For example, the first conductive layer and the second conductive layer are made of the same material such as Ru or Ir which has a high formability to the reactive ion etching. However, the first conductive layer in contact with the high dielectric oxide layer is deposited at a low deposition rate by applying the sputter target with the low power level of not higher than 1.7 W/cm$^2$, whilst the second conductive layer separated from the high dielectric oxide layer is deposited at a high deposition rate by applying the sputter target with the high power level of higher than 1.7 W/cm$^2$.

It is also preferable that the first and second conductive layers are deposited by a chemical vapor deposition process under a first deposition condition and a second deposition condition.

It is also preferable that the first and second conductive layers are deposited by an evaporation process under a first deposition condition and a second deposition condition.

It is also preferable that the conductive material includes at least any one of Ru, RuO$_2$, Ir, IrO$_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is also preferable that the first conductive layer has a thickness of about one-tenth of a thickness of the second conductive layer. It is also preferable that the first conductive layer has a thickness of about one-tenth of a thickness of the second conductive layer. It is not essential for the present invention to limit the thickness of the first conductive layer in contact with the high dielectric oxide layer. It is, however, preferable that the first conductive layer is very thin. The thickness of the first conductive layer is preferably not more than 10 nanometers, and more preferably 5 nanometers. It is also not essential for the present invention to limit the thickness of the second conductive layer separated from the high dielectric oxide layer. It is, however, preferable that the thickness of the second conductive layer is thicker by about ten times than the first conductive layer.

The fourth aspect of the present invention provides a method of forming a top electrode on a high dielectric oxide layer of a thin film capacitor. The method comprises the steps of: carrying out a first deposition of a first conductive material having a formability to a reactive ion etching under a first deposition condition of a first deposition rate to deposit a first conductive layer on the high dielectric oxide layer; and carrying out a second deposition of a second conductive material having a formability to the reactive ion etching under a second deposition condition of a second deposition rate which is higher than the first deposition rate to deposit a second conductive layer on the first conductive layer, wherein an interface between the first conductive layer and the high dielectric oxide layer is such that a density of a leak current across the interface is suppressed at not higher than $1\times10^{-8}$ A/cm$^2$ upon applying a voltage of 2 V across the dielectric oxide layer after the multi-layer structure has been subjected to a heat treatment at 350° C.

The above novel thin film capacitor provides the following advantages.

First, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor.

Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

It is preferable that the first conductive layer is deposited at the first deposition rate by a first sputtering process with applying a target with a first power and then the second conductive layer is deposited at the second deposition rate by a second sputtering process with applying the target with a second power which is higher than the first power.

It is also preferable that the first power is less than 1.7 W/cm$^2$, and the second power is more than 1.7 W/cm$^2$. It is not essential for the present invention to limit the power level to be applied to the sputter target, but it is preferable to apply a low power level of, for example, 1.7 W/cm$^2$ to the sputter target for a low rate deposition of the first conductive layer in contact with the high dielectric oxide layer in order to prevent the surface of the high dielectric oxide layer from receipt of any substantive damage. In this case, the thin film capacitor shows the good current leakage characteristics such that the leak current density remains suppressed at not higher than $1\times10^{-8}$ A/cm$^2$ under applications to the target with the driving voltage in the range of 0 V to 2 V. If, however, the sputter target is applied with a higher power level than 1.7 W/cm$^2$ for a high rate deposition of the first conductive layer in contact with the high dielectric oxide layer in order to provide the surface of the high dielectric oxide layer from receipt of any substantive damage, then the thin film capacitor shows the undesirable current leakage characteristics such that the leak current density shows a rapid increase from $1\times10^{-8}$ A/cm$^2$ as the driving voltage to be applied to the target is increased from 1.5 V. Consequently, it is preferable that the power level applied to the sputter target for a low rate deposition of the first conductive layer in contact with the high dielectric oxide layer is suppressed at, for example, not higher than 1.7 W/cm$^2$.

Namely, it is preferable that the first voltage level applied to the target for a low rate deposition of the first conductive layer is set not higher then 1.7 W/cm$^2$, whilst the second voltage level applied to the target for a high rate deposition of the second conductive layer is set higher that 1.7 W/cm$^2$.

For example, the first conductive layer and the second conductive layer are made of the same material such as Ru or Ir which has a high formability to the reactive ion etching. However, the first conductive layer in contact with the high dielectric oxide layer is deposited at a low deposition rate by applying the sputter target with the low power level of not higher than 1.7 W/cm$^2$, whilst the second conductive layer separated from the high dielectric oxide layer is deposited at a high deposition rate by applying the sputter target with the high power level of higher than 1.7 W/cm$^2$.

It is also preferable that the first and second conductive layers are deposited by a chemical vapor deposition process under a first deposition condition and a second deposition condition.

It is also preferable that the first and second conductive layers are deposited by an evaporation process under a first deposition condition and a second deposition condition.

It is also preferable that the conductive material includes at least any one of Ru, RuO$_2$, Ir, IrO$_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

It is also preferable that the first conductive layer has a thickness of about one-tenth of the thickness of the second conductive layer. It is not essential for the present invention to limit the thickness of the first conductive layer in contact with the high dielectric oxide layer. It is, however, preferable that the first conductive layer is very thin. The thickness of the first conductive layer is preferably not more than 10 nanometers, and more preferably 5 nanometers. It is also not essential for the present invention to limit the thickness of the second conductive layer separated from the high dielectric oxide layer. It is, however, preferable that the thickness of the second conductive layer is thicker by about ten times than the first conductive layer.

Figure 1:
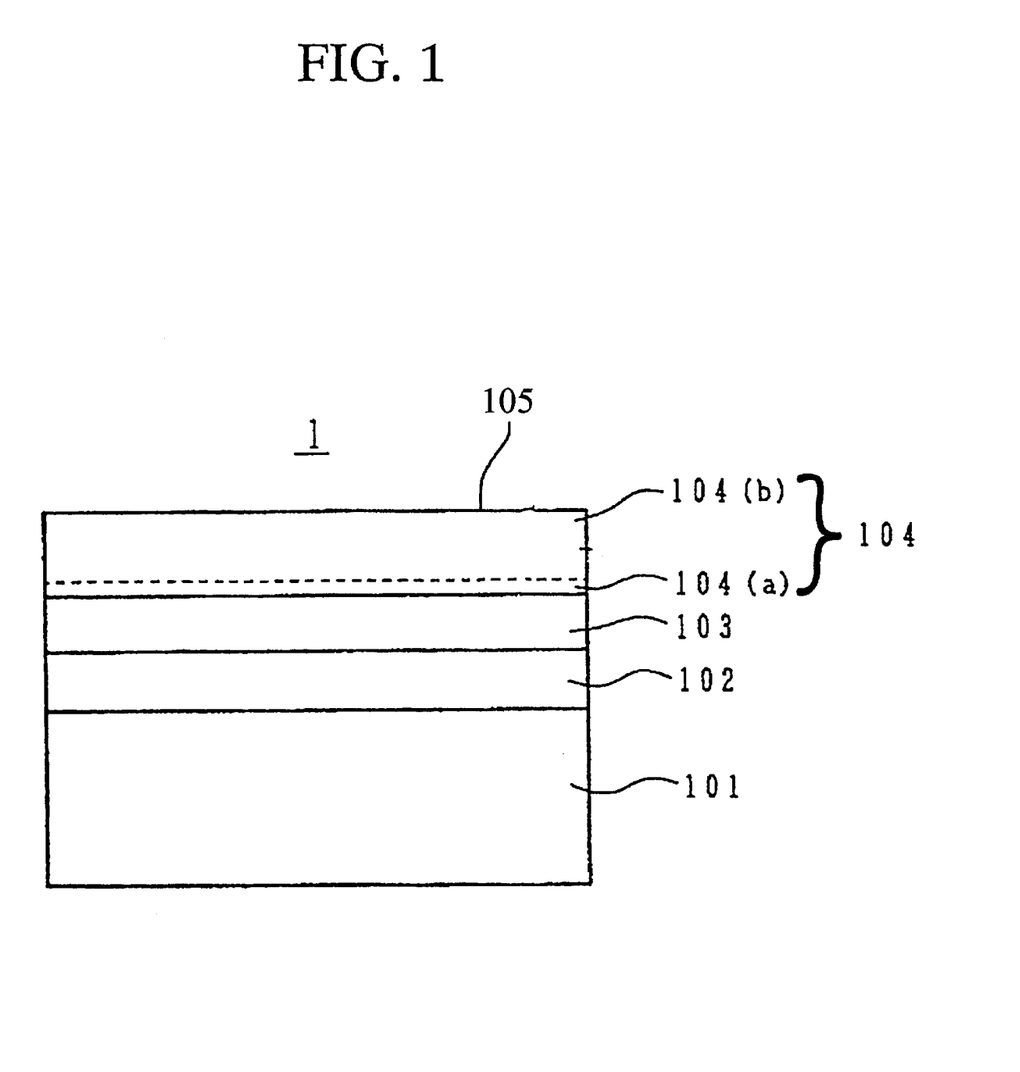
FIG. 1 is a fragmentary across sectional elevation view illustrative of a novel thin film capacitor with an improved top electrode in accordance with the foregoing present inventions.

FIG. 1 is a fragmentary across sectional elevation view illustrative of a novel thin film capacitor with an improved top electrode in accordance with the foregoing present inventions. A novel thin film capacitor 1 has the following structure. A bottom electrode layer 102 is provided on a semiconductor substrate 101. A high dielectric oxide layer 103 is provided on the bottom electrode layer 102. A top electrode 105 is provided on a high dielectric oxide layer 103. The top electrode 105 further comprises a conductive layer 104 made of a single conductive material which shows a formability to a reactive ion etching. The conductive layer 104 further comprises a first part 104a which has been deposited at a first deposition rate and a second part 104b which has been deposited on the first part 104a at a second deposition rate which is higher than the first deposition rate.

The first part 104a and the second part 104b are made of the same conductive material but are deposited at different deposition rates from each other so that the second deposition rate of the second part 104b is higher than the first deposition rate of the first part 104a. After the above thin film capacitor 1 having the top electrode layer 104 is subjected to a heat treatment at 350° C., the above thin film capacitor 1 shows a good leak current density characteristic such that the leak current density remains suppressed yet not higher than $1\times10^{-8}$ A/cm$^2$ under application of a driving voltage in the range of 0 V to 2 V.

It is preferable that the conductive layer 104 includes at least any one of Ru, RuO$_2$, Ir, IrO$_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

The conductive layer 104 may be deposited by any one of a sputtering method, a chemical vapor deposition method and an evaporation method, provided that the second deposition rate of the second part 104b is higher than the first deposition rate of the first part 104a.

When the sputtering method is applied to deposit the top electrode 105, the first part 104a is deposited by applying a target with a first power and then the second part 104b is deposited by applying the same target with a second power which is higher than the first power so that the second deposition rate of the second part 104b is higher than the first deposition rate of the first part 104a.

It is not essential for the present invention to limit the power level to be applied to the sputter target, but it is preferable to apply a low power level of, for example, 1.7 W/cm$^2$ to the sputter target for a low rate deposition of the first part 104a in contact with the high dielectric oxide layer 103 in order to prevent the surface of the high dielectric oxide layer 103 from receipt of any substantive damage. In this case, the thin film capacitor shows the good current leakage characteristics such that the leak current density remains suppressed at not higher than $1\times10^{-8}$ A/cm$^2$ under applications to the target with the driving voltage in the range of 0 V to 2 V. If, however, the sputter target is applied with a higher power level than 1.7 W/cm$^2$ for a high rate deposition of the first part 104a in contact with the high dielectric oxide layer 103 in order to provide the surface of the high dielectric oxide layer 103 from receipt of any substantive damage, then the thin film capacitor shows the undesirable current leakage characteristics such that the leak current density shows a rapid increase from $1\times10^{-8}$ A/cm$^2$ as a driving voltage to be applied to the target is increased from 1.5 V. Consequently, it is preferable that the power level applied to the sputter target for a low rate deposition of the first part 104a in contact with the high dielectric oxide layer 103 is suppressed at, for example, not higher than 1.7 W/cm$^2$.

Namely, it is preferable that the first voltage level applied to the target for a low rate deposition of the first part 104a is set not higher than 1.7 W/cm$^2$, whilst the second voltage level applied to the target for a high rate deposition of the second part 104b is set higher than 1.7 W/cm$^2$.

For example, the first part 104a and the second part 104b are made of the same material such as Ru or Ir which has a high formability to the reactive ion etching. However, the first part 104a in contact with the high dielectric oxide layer 103 is deposited at a low deposition rate by applying the sputter target with the low power level of not higher than 1.7 W/cm$^2$, whilst the second part 104b separated from the high dielectric oxide layer 103 is deposited at a high deposition rate by applying the sputter target with the high power level of higher than 1.7 W/cm$^2$.

It is also preferable that a first thickness of the first part 104a is much thinner than a second thickness of the second part 104b. For example, the first thickness of the first part 104a is about one tenth of the second thickness of the second part 104b.

The above novel thin film capacitor 1 with the improved top electrode 105 may be fabricated as follows. The bottom electrode 102 is deposited on the semiconductor substrate 101. The high dielectric oxide layer 103 is deposited on the bottom electrode 102. The top electrode 105 is then deposited on the high dielectric oxide layer 103, wherein the first part 104a is deposited on the high dielectric oxide layer 103 at a lower deposition rate before the second part 104b is deposited on the first part 104a at a higher deposition rate. The first part 104a and the second part 104b are made of the same material such as Ru or Ir which has a high formability to the reactive ion etching. However, the first part 104a in contact with the high dielectric oxide layer 103 is deposited at a low deposition rate by applying the sputter target with the low power level of not higher than 1.7 W/cm$^2$, whilst the second part 104b separated from the high dielectric oxide layer 103 is deposited at a high deposition rate by applying the sputter target with the high power level of higher than 1.7 W/cm$^2$.

The conductive layer 104 may be deposited by any one of a sputtering method, a chemical vapor deposition method and an evaporation method, provided that the second deposition rate of the second part 104b is higher than the first deposition rate of the first part 104a.

It is not essential for the present invention to limit the thickness of the first part 104a in contact with the high dielectric oxide layer 103. It is, however, preferable that the first part 104a is very thin. The thickness of the first part 104a is preferably not more than 10 nanometers, and more preferably 5 nanometers.

It is also not essential for the present invention to limit the thickness of the second part 104b separated from the high dielectric oxide layer 103. It is, however, preferable that the thickness of the second part 104b is thicker by about ten times than the first part 104a.

The top electrode 105 further comprises a conductive layer 104 made of a single conductive material which shows a formability to a reactive ion etching. The conductive layer 104 further comprises a first part 104a which has been deposited at a first deposition rate and a second part 104b which has been deposited on the first part 104a at a second deposition rate which is higher than the first deposition rate. The first part 104a and the second part 104b are made of the same conductive material but are deposited at different deposition rates from each other so that the second deposition rate of the second part 104b is higher than the first deposition rate of the first part 104a. After the above thin film capacitor 1 having the top electrode layer 104 is subjected to a heat treatment at 350° C., the above thin film capacitor 1 shows a good leak current density characteristic such that the leak current density remains suppressed at not higher than $1 \times 10^{-8}$ A/cm$^2$ under application of a driving voltage in the range of 0 V to 2 V.

It is preferable that the conductive layer 104 includes at least any one of Ru, RuO$_2$, Ir, IrO$_2$, and alloys thereof because of those materials have high formability to the reactive ion etching. This allows a further substantive scaling down of the thin film capacitor 1 with a high accurate dimension to be defined by the reactive ion etching. This further substantive scaling down of the thin film capacitor 1 allows an increase in density of integration of the semiconductor devices and integrated circuits.

First, the above novel thin film capacitor has the good electric characteristics. The material of the first part in contact with the high dielectric oxide layer is deposited at a low deposition rate under a low deposition power to prevent reaction on the interface between the first part and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first part is deposited at a sufficiently low deposition rate for prevent the top surface of the high dielectric oxide layer from receiving any substantive damage, whilst the second part is deposited at a sufficiently high deposition rate for shortening a total time for depositions of the first and second conductive layers.

Third, the first part intervening between the second part and the high dielectric oxide layer prevents peeling of the top electrode from the high dielectric oxide layer for improvement in the yield of the thin film capacitor.

Fourth, the material of the first and second parts are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

Figure 2:
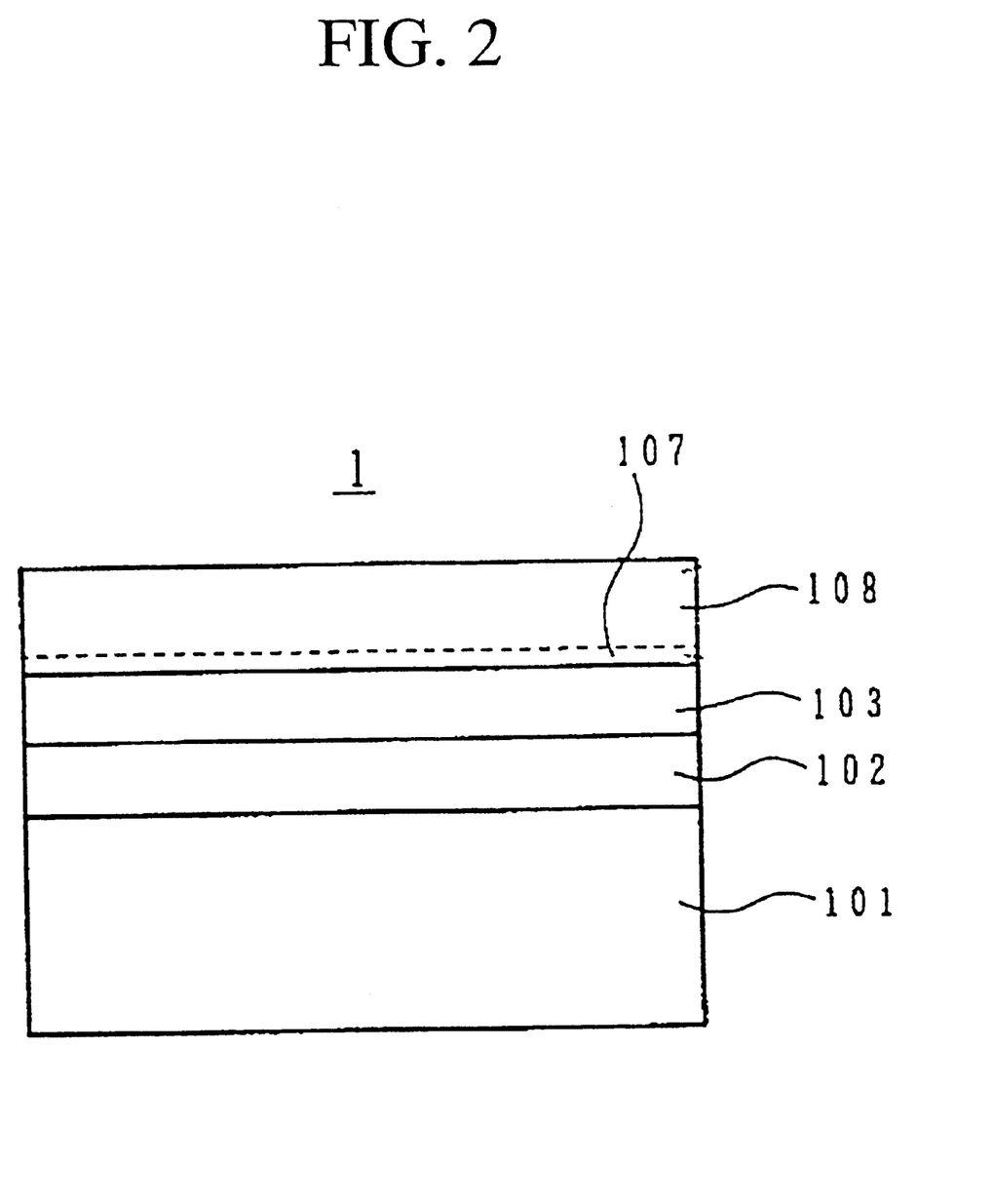
FIG. 2 is a fragmentary across sectional elevation view illustrative of another novel thin film capacitor with an improved top electrode in accordance with the foregoing present inventions.

FIG. 2 is a fragmentary across sectional elevation view illustrative of another novel thin film capacitor with an improved top electrode in accordance with the foregoing present inventions. A novel thin film capacitor 1 has the following structure. A bottom electrode layer 102 is provided on a semiconductor substrate 101. A high dielectric oxide layer 103 is provided on the bottom electrode layer 102. A top electrode 105 is provided on the high dielectric oxide layer 103. The top electrode 105 further comprises a first conductive layer 107 made of a first conductive material which shows a formability to a reactive ion etching and a second conductive layer 108 made of a second conductive material which shows a formability to the reactive ion etching. The first conductive layer 107 is formed on the high dielectric oxide layer 103 and the second conductive layer 108 is formed on the first conductive layer 107. The first conductive layer 107 is deposited at a first deposition rate and the second conductive layer 108 is deposited at a second deposition rate which is higher than the first deposition rate. The first conductive layer 107 and the second conductive layer 108 are made of different conductive materials from each other and are deposited at different deposition rates wherein the deposition rate of the second conductive layer 108 is higher than the deposition rate of the first conductive layer 107. After the above thin film capacitor 2 having the top electrode layer 105 comprising the first conductive layer 107 and the second conductive layer 108 is subjected to a heat treatment at 350° C., the above thin film capacitor 1 shows a good leak current density characteristic such that the leak current density remains suppressed at not higher than $1 \times 10^{-8}$ A/cm$^2$ under application of a driving voltage in the range of 0 V to 2 V.

It is preferable that the first conductive layer 107 includes at least any one of Ru, $RuO_2$, Ir, $IrO_2$, and alloys thereof and the second conductive layer 108 also includes at least other one of Ru, $RuO_2$, Ir, $IrO_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 2 allows an increase in density of integration of the semiconductor devices and integrated circuits.

The first conductive layer 107 and the second conductive layer 108 may be deposited by any one of a sputtering method, a chemical vapor deposition method and an evaporation method, provided that the second deposition rate of the second conductive layer 108 is higher than the first deposition rate of the first conductive layer 107.

When the sputtering method is applied to deposit the top electrode 105, the first conductive layer 107 is deposited by applying a target with a first power and then the second conductive layer 108 is deposited by applying the same target with a second power which is higher than the first power so that the second deposition rat of the second conductive layer 108 is higher than the first deposition rate of the first conductive layer 107.

It is not essential for the present invention to limit the power level to be applied to the sputter target, but it is preferable to apply a low power level of, for example, 1.7 $W/cm^2$ to the sputter target for a low rate deposition of the first conductive layer 107 in contact with the high dielectric oxide layer 103 in order to prevent the surface of the high dielectric oxide layer 103 from receipt of any substantive damage. In this case, the thin film capacitor shows the good current leakage characteristics such that the leak current density remains suppressed at not higher than $1 \times 10^{-8}$ $A/cm^2$ under applications to the target with the driving voltage in the range of 0 V to 2 V. If, however, the sputter target is applied with a higher power level than 1.7 $W/cm^2$ for a high rate deposition of the first conductive layer 107 in contact with the high dielectric oxide layer 103 in order to provide the surface of the high dielectric oxide layer 103 from receipt of any substantive damage, then the thin film capacitor shows the undesirable current leakage characteristics such that the leak current density shows a rapid increase from $1 \times 10^{-8}$ $A/cm$ as the driving voltage to be applied to the target is increased from 1.5 V. Consequently, it is preferable that the power level applied to the sputter target for a low rate deposition of the first conductive layer 107 in contact with the high dielectric oxide layer 103 is suppressed at, for example, not higher than 1.7 $W/cm^2$.

Namely, it is preferable that the first voltage level applied to the target for a low rate deposition of the first conductive layer 107 is set not higher than 1.7 $W/cm^2$, whilst the second voltage level applied to the target for a high rate deposition of the second conductive layer 108 is set higher than 1.7 $W/cm^2$.

For example, the first conductive layer 107 is made of Ru which has a high formability to the reactive ion etching and the second conductive layer 108 is made of Ir which also has a high formability to the reactive ion etching. Further, the first conductive layer 107 in contact with the high dielectric oxide layer 103 is deposited at a low deposition rate by applying the sputter target with the low power level of not higher than 1.7 $W/cm^2$, whilst the second conductive layer 108 separated from the high dielectric oxide layer 103 is deposited at a high deposition rate by applying the sputter target with the high power level of higher than 1.7 $W/cm^2$.

It is also referable that a first thickness of the first conductive layer 107 is much thinner than a second thickness of the second conductive layer 108. For example, the first thickness of the first conductive layer 107 is about one tenth of the second thickness of the second conductive layer 108.

The above novel thin film capacitor 2 with the improved top electrode 105 may be fabricated as follows. The bottom electrode 102 is deposited on the semiconductor substrate 101. The high dielectric oxide layer 103 is deposited on the bottom electrode 102. The top electrode 105 is then deposited on the high dielectric oxide layer 103, wherein the first conductive layer 107 is deposited on the high dielectric oxide layer 103 at a lower deposition rate before the second conductive layer 108 is deposited on the first conductive layer 107 at a higher deposition rate. The first conductive layer 107 is made of Ru which has a high formability to the reactive ion etching and the second conductive layer 108 is made of Ir which also has a high formability to the reactive ion etching. Further, the first conductive layer 107 in contact with the high dielectric oxide layer 103 is deposited at a low deposition rate by applying the sputter target with the low power level of not higher than 1.7 $W/cm^2$, whilst the second conductive layer 108 separated from the high dielectric oxide layer 103 is deposited at a high deposition rate by applying the sputter target with the high power level of higher than 1.7 $W/cm^2$.

The first conductive layer 107 and the second conductive layer 108 may be deposited by any one of a sputtering method, a chemical vapor deposition method and an evaporation method, provided that the second deposition rate of the second conductive layer 108 is higher than the first deposition rate of the first conductive layer 107.

It is not essential for the present invention to limit the thickness of the first conductive layer 107 in contact with the high dielectric oxide layer 103. It is, however, preferable that the first conductive layer 107 is very thin. The thickness of the first conductive layer 107 is preferably not more than 10 nanometers, and more preferably 5 nanometers.

It is also not essential for the present invention to limit the thickness of the second conductive layer 108 separated from the high dielectric oxide layer 103. It is, however, preferable that the thickness of the first conductive layer 107 is thicker by about ten times than the first conductive layer 107.

The top electrode 105 further comprises a first conductive layer 107 made of a first conductive material which shows a formability to a reactive ion etching and a second conductive layer 108 made of a second conductive material which shows a formability to the reactive ion etching. The first conductive layer 107 is formed on the high dielectric oxide layer 103 and the second conductive layer 108 is formed on the first conductive layer 107. The first conductive layer 107 is deposited at a first deposition rate and the second conductive layer 108 is deposited at a second deposition rate which is higher than the first deposition rate. The first conductive layer 107 and the second conductive layer 108 are made of different conductive materials from each other and are deposited at different deposition rates wherein the deposition rate of the second conductive layer 108 is higher than the deposition rate of the first conductive layer 107. After the above thin film capacitor 2 having the top electrode layer 105 comprising the first conductive layer 107 and the second conductive layer 108 is subjected to a heat treatment at 350° C., the above thin film capacitor 1 shows a good leak current density characteristic such that the leak current density remains suppressed at not higher than $1 \times 10^{-8}$ A/cm$^2$ under application of a driving voltage in the range of 0 V to 2 V.

It is preferable that the first conductive layer 107 includes at least any one of Ru, RuO$_2$, Ir, IrO$_2$, and alloys thereof and the second conductive layer 108 also includes at least other one of Ru, RuO$_2$, Ir, IrO$_2$, and alloys thereof because those materials have high formability to the reactive ion etching. This allows a further substantive scaling down of the thin film capacitor 1 with a high accurate dimension to be defined by the reactive ion etching. This further substantive scaling down of the thin film capacitor 2 allows an increase in density of integration of the semiconductor devises and integrated circuits.

The above novel thin film capacitor provides the following advantages.

First, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor.

Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

Figure 3:
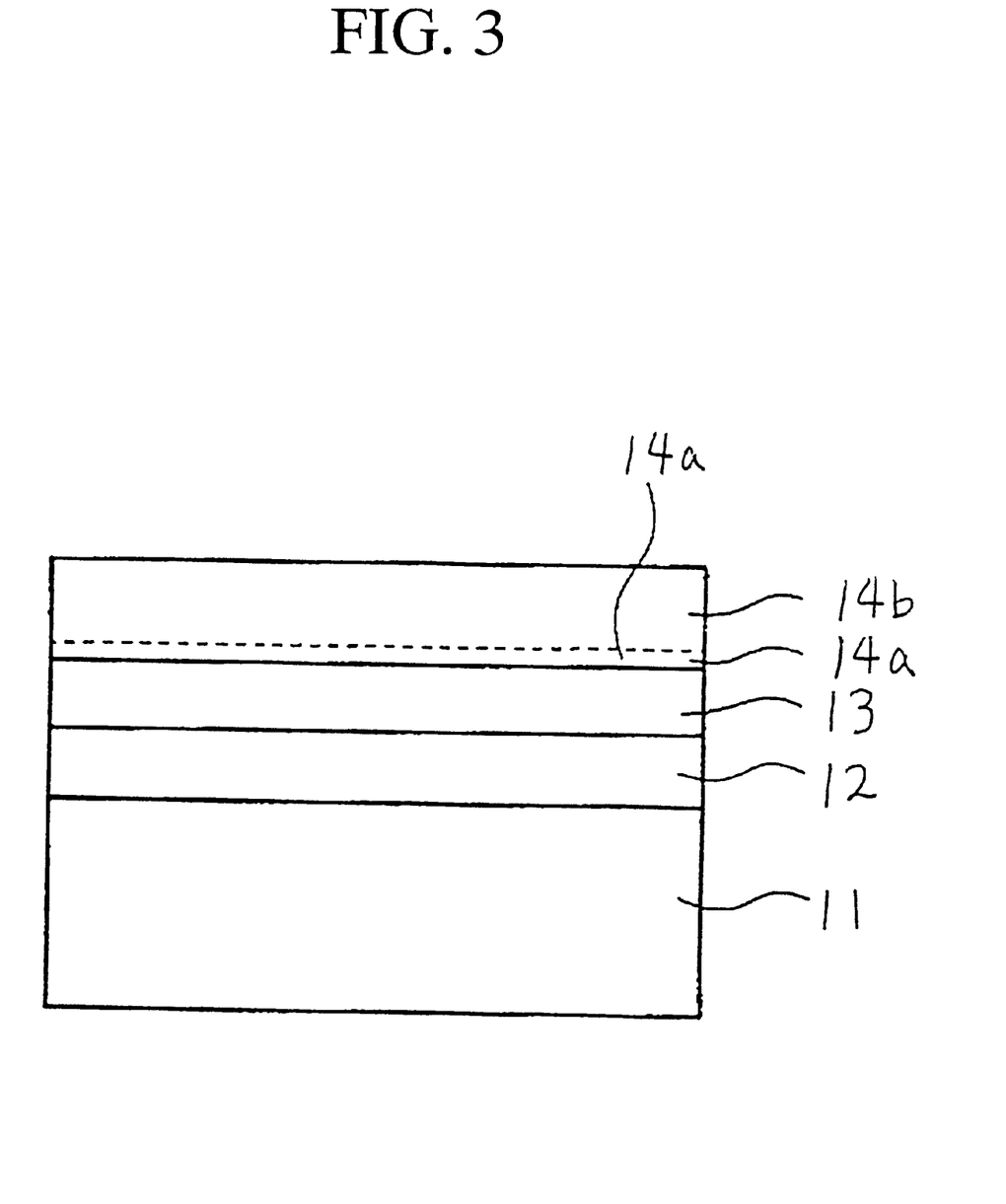
FIG. 3 is a fragmentary cross sectional elevation view illustrative of a novel thin film capacitor with an improved top electrode structure in a first embodiment in accordance with the present invention.

A first embodiment according to the present invention will be described in detail with reference to FIG. 3 which is a fragmentary cross sectional elevation view illustrative of a novel thin film capacitor with an improved top electrode structure in a first embodiment in accordance with the present invention.

An n-type silicon substrate 11 having a resistivity of 0.1 Ωcm was prepared. A bottom electrode 12 of RuO$_2$ having a thickness of 200 nanometers was deposited on the silicon substrate 11 by a first DC sputtering method. An electron cyclotron resonance chemical vapor deposition method was carried out by use of Ba(DPM)$_2$, Ti(i-OC$_3$H$_7$) and oxygen gases under conditions of a substrate temperature of 500° C., a gas pressure of 7 mTorr, and a plasma excitation microwave power of 500 W, thereby depositing a (Ba, Sr)TiO$_3$ high dielectric oxide layer 13 with a thickness of 30 nanometers on the bottom electrode 12.

A second DC sputtering method was carried out under deposition conditions of a deposition temperature of 25° C., a gas pressure of 4 mTorr, and a DC power of 0.6 W/cm$^2$, and a deposition rate of 5.6 nanometers/min. thereby depositing an Ru first part 14a with a thickness of 5 nanometers on the (Ba, Sr)TiO$_3$ high dielectric oxide layer 13.

The above second DC sputtering method was continued but under different conditions of a deposition temperature of 25° C., a gas pressure of 4 mTorr, and a DC power of 4.5 W/cm$^2$, and a deposition rate of 21 nanometers/min. thereby depositing an Ru second part 14b with a thickness of 50 nanometers on the Ru first part 14a. As a result, the novel thin film capacitor was completed.

The Ru second part 14b was deposited at the second deposition rate which is higher than the first deposition rate of the Ru first part 14a in contact with the (Ba, Sr)TiO$_3$ high dielectric oxide layer 13 so as to shorten the deposition time necessary for forming the top electrode 15, thereby improving the throughput.

Thereafter, the novel thin film capacitor was placed in oxygen and nitrogen gases at a temperature of 350° C. for 30 minutes.

It was confirmed that the first deposition condition for depositing the first part 14a contributes to suppress the peeling of the top electrode 15 from the (Ba, Sr)TiO$_3$ high dielectric oxide layer 13. This results in improvement in reliability of the thin film capacitor.

The adhesiveness was evaluated by varying the thickness of the first part 104a in the range of 5–20 nanometers. It was also confirmed that the adhesiveness is improved as the thickness of the first part 14a is made thin. The thickness of the first part 14a is not more than 10 nanometers, and preferably about 5 nanometers.

As a comparative embodiment, the conventional thin film capacitor having the single layered Ru top electrode deposited under the same deposition rate as the second part 14b and at 1.7 W/cm$^2$ was prepared before the conventional thin film capacitor was also placed in oxygen and nitrogen gases at a temperature of 350° C. for 30 minutes.

Figure 5:
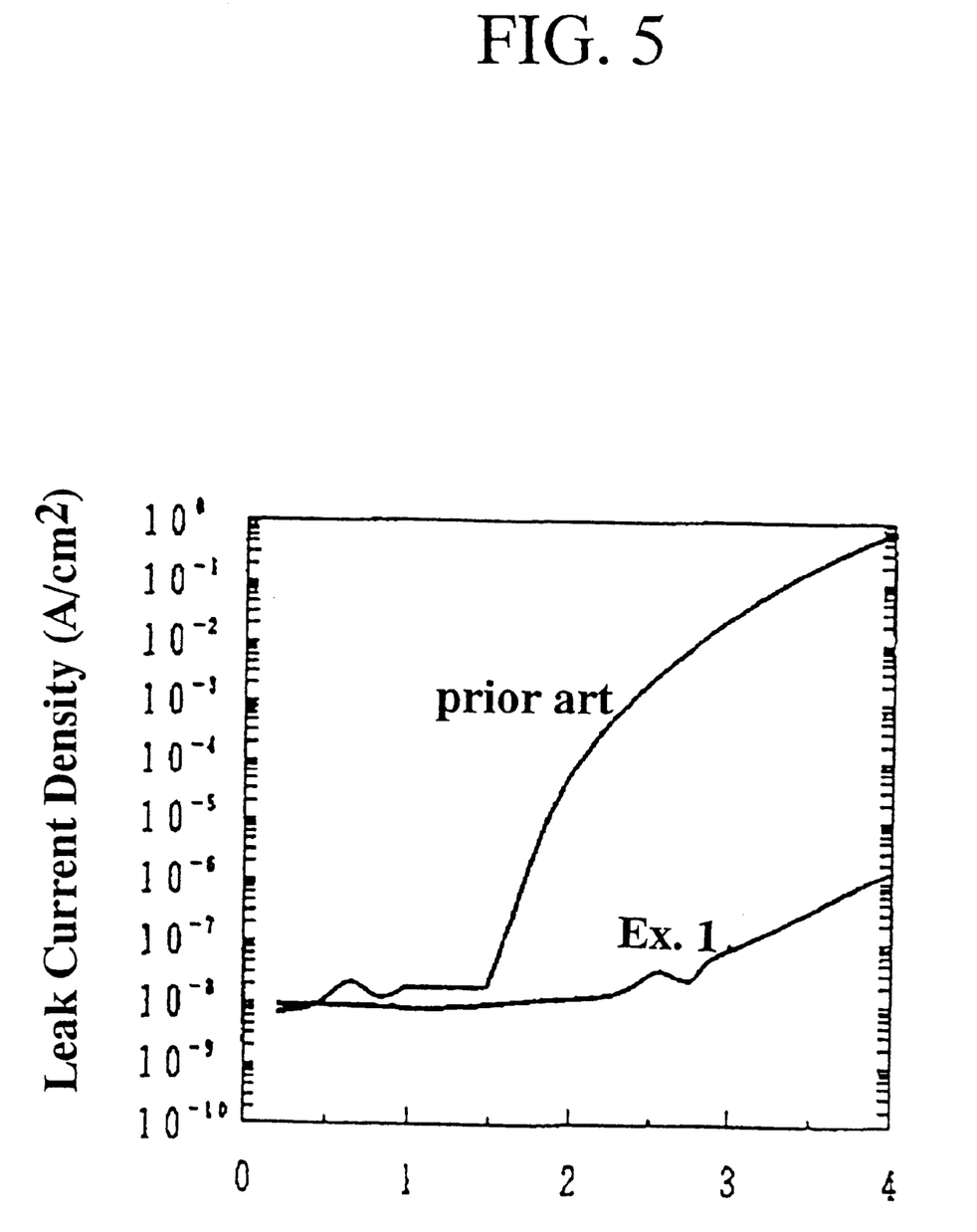
FIG. 5 is a diagram illustrative of variations in density of leak current of the novel thin film capacitor with the improved top electrode structure and the conventional thin film capacitor.

FIG. 5 is a diagram illustrative of variations in density of leak current of the novel thin film capacitor with the improved top electrode structure and the conventional thin film capacitor. It was shown that the leak current characteristics of the novel thin film capacitor are remarkably improved as compared to the leak current characteristics of the conventional thin film capacitor.

As the driving voltage applied to the thin film capacitor is over 1.5 V, the conventional thin film capacitor shows the undesirable current leakage characteristics such that the leak current density shows a rapid increase from $1 \times 10^{-8}$ A/cm$^2$.

FIG. 5 apparently shows that when the prior art was applied, then the current leakage characteristics of the conventional thin film capacitor are not good, for example, a leak current density of not less than $1 \times 10^{-6}$ A/cm$^2$ upon zero driving voltage application to the thin film capacitor. Upon increase in the driving voltage to the thin film capacitor, the thin film capacitor shows a simple increase in the leak current density. In contrast to the conventional thin film capacitor, the novel thin film capacitor with the improved double-layered top electrode shows good current leakage characteristics, for example, a low leak current density of not less than $1 \times 10^{-8}$ A/cm$^2$ upon zero driving voltage application to the thin film capacitor. Upon increase in the driving voltage from 0 V to about 2 V, the above low leak current density almost remains unchanged. For example, under the application of the driving voltage of 2 V to the novel thin film capacitor, the leak current density remains not less than $1 \times 10^{-8}$ A/cm$^2$. Namely, the novel thin film capacitor shows the stable and good leak characteristics.

The adhesiveness of the Pt first conductive layer 14 to the (Ba, Sr)TiO$_3$ high dielectric oxide layer 13 was evaluated by varying the thickness of the Pt first conductive layer 14 in the range of 5–20 nanometers. It was confirmed that as the thickness of the Pt first conductive layer 14 is reduced, the adhesiveness of the Pt first conductive layer 14 to the (Ba, Sr)TiO$_3$ high dielectric oxide layer 13 is improved. For example, a preferable thickness range of the Pt first conductive layer 14 is not thicker than 10 nanometers. In contrast, the thin film capacitor shows the good current leakage characteristics such that the leak current density remains suppressed at not higher than 1×10$^{-8}$ A/cm$^2$ under applications to the target with the driving voltage in the range of 0 V to 3 V.

Since the first part 14a deposited at the low deposition rate is thin, it is possible to shorten the necessary time for depositing the top electrode for improvement in throughput of the thin film capacitor.

As a modification to the above, the first part 14a was deposited by an evaporation method. The thin film capacitor was then subjected to the evaluations in the leak current characteristics and adhesiveness. It was confirmed that the thin film capacitor shows the good leak current characteristics and high adhesiveness.

As a further modification to the above, the first part 14a was deposited by a chemical vapor deposition method. The thin film capacitor was then subjected to the evaluations in the leak current characteristics and adhesiveness. It was confirmed that the thin film capacitor shows the good leak current characteristics and high adhesiveness.

The above improved top electrode structure allows the thin film capacitor to have good leak current characteristics with high throughput and high yield conditions.

Figure 6:
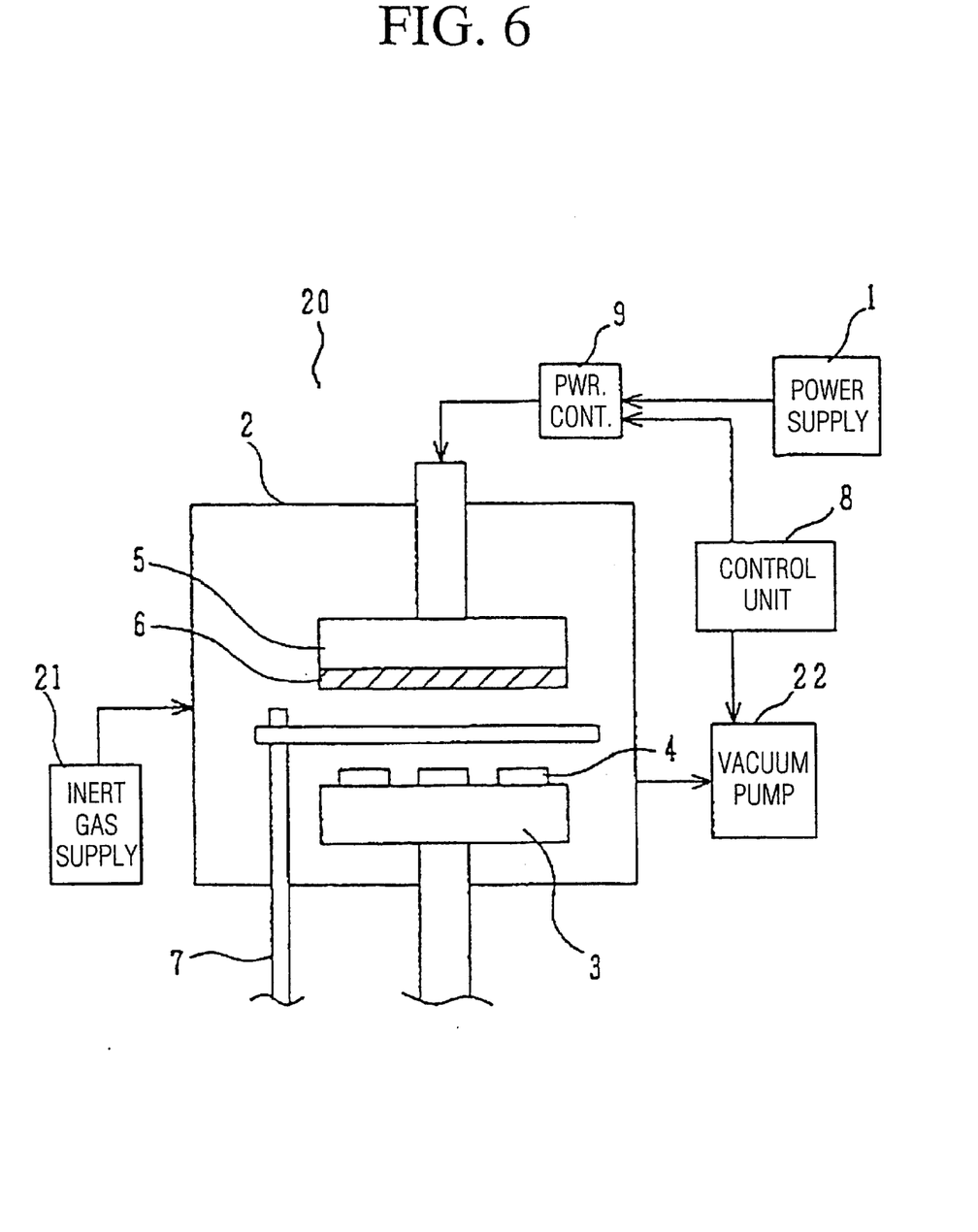
FIG. 6 is block diagram illustrative of a structure of a sputtering system as one example of the available sputtering systems for depositing the electrodes of the novel thin film capacitor.

Available sputtering systems for depositing the electrodes of the novel thin film capacitor are not limited to a specific one. FIG. 6 is a block diagram illustrative of a structure of a sputtering system as one example of the available sputtering systems for depositing the electrodes of the novel thin film capacitor. The sputtering system 20 has a vacuum changer 2 which accommodates a substrate holder 3 on which substrates 4 are mounted for forming a novel thin film capacitor. The vacuum chamber 2 also accommodates a high frequency electrode plate 5 with a sputter target 6 which faces to the substrate 4 on the substrate holder 3 and is distanced from the substrates 4 on the substrate holder 3. It is of course possible to provide the high frequency electrode plate 5 with plural different sputter targets 6. It is alternatively possible to provide a plurality of the high frequency electrode plate 5 so that different targets 6 are provided on the plural high frequency electrode plates 5. A shutter 7 may optionally be provided between the substrate holder 3 and the high frequency electrode plate 5. An inert gas supplier 21 is further provided for supplying an inert gas into the vacuum chamber 2. A vacuum pump 22 is also provided for causing a vacuum of the vacuum chamber 2. A high frequency power supply 10 and a power controller 9 are provided for supplying a high frequency power through the power controller 9 to the high frequency electrode plate 5 under control of the power, whereby the power controller 9 controls the power to be applied to the target 6 on the high frequency electrode plate 5. Since the deposition rate depends on a voltage corresponding to the power to be applied to the target 6, then the power controller 9 controls the deposition rate. A control unit 8 is further provided which is connected to both the vacuum pump 22 and the power controller 9 for controlling the deposition time of sputtering process and a degree of the vacuum in the vacuum chamber 2.

The above novel thin film capacitor with the improved double-layered top electrode structure possesses the following advantages and effects.

First, the above novel thin film capacitor has the good electric characteristics. The material of the first part in contact with the high dielectric oxide layer is deposited at a low deposition rate under a low deposition power to prevent reaction on the interface between the first part and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first part is deposited at a sufficiently low deposition rate for prevent the top surface of the high dielectric oxide layer from receiving any substantive damage, whilst the second part is deposited at a sufficiently high deposition rate for shortening a total time for depositions of the first and second conductive layers.

Third, the first part intervening between the second part and the high dielectric oxide layer prevents peeling of the top electrode from the high dielectric oxide layer for improvement in the yield of the thin film capacitor.

Fourth, the material of the first and second parts are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention. In this embodiment, the bottom electrode is made of RuO$_2$. Notwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru, Ir, Re, Os, Rh, and oxides thereof as well as at least any one selected from the group of silicide compounds in addition at least any one selected from the group of Pt, Au, Ag, Pd, Ni, Co and alloys thereof.

Further, the bottom electrode may be modified to have multi-layer structure.

In place of (Ba, Sr)TiO$_3$, materials represented by a chemical formula ABO$_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fe, Zn and W. For example, there are available SrTiO$_3$, (Sr, Ca)TiO$_3$, (Ba, Sr, Ca)TiO$_3$, PbTiO$_3$, Pb(Zr, Ti)O$_3$, (Pb, La)(Zr, Ti)O$_3$, Pb(Mg, Nb)O$_3$, Pb(Mg, W)O$_3$, Pb(Zn, Nb)O$_3$LiTaO$_3$, LiNbO$_3$, KTaO$_3$, KTaO$_3$, KTaO$_3$, and KNbO$_3$. Further, there are available materials represented by the chemical formula (Bi$_2$O$_2$)(A$_{m-1}$B$_m$O$_{3m+1}$) (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, Ba$_4$Ti$_3$O$_{12}$, SrBa$_2$Ta$_2$O$_9$, and SrBa$_2$Nb$_2$O$_9$ are also available. In addition, Ta$_2$O$_5$ is further available which has a chemical composition different from those of the above chemical formula.

The above high dielectric oxide layer may be modified to have a multi-layered structure.

Figure 4:
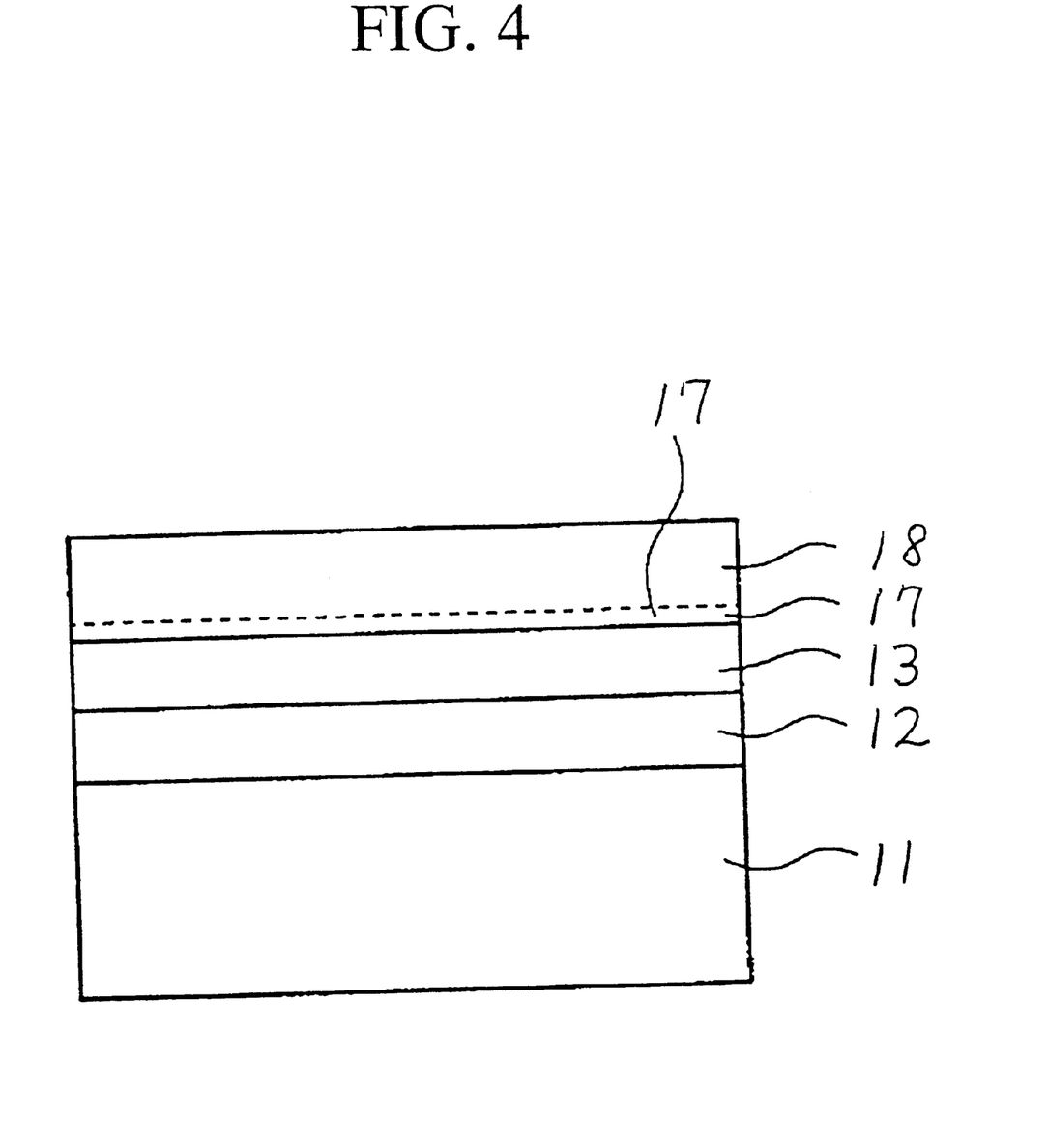
FIG. 4 is a fragmentary cross sectional elevation view illustrative of a novel thin film capacitor with an improved top electrode structure in a first embodiment in accordance with the present invention.

A second embodiment according to the resent invention will be described in detail with reference to FIG. 4 which is a fragmentary cross sectional elevation view illustrative of a novel thin film capacitor with an improved top electrode structure in a first embodiment in accordance with the present invention.

An n-type silicon substrate 11 having a resistivity of 0.1 Ωcm was prepared. A bottom electrode 12 of $RuO_2$ having a thickness of 200 nanometers was deposited on the silicon substrate 11 by a first DC sputtering method. An electron cyclotron resonance chemical vapor deposition method was carried out by use of $Ba(DPM)_2$, $Sr(DPM)_2$, $Ti(iOC_3H_7)$ and oxygen gases under conditions of a substrate temperature of 500° C., a gas pressure of 7 mTorr, and a plasma excitation microwave power of 500 W, thereby depositing a (Ba, Sr)$TiO_3$ high dielectric oxide layer 13 with a thickness of 30 nanometers on the bottom electrode 12.

A second DC sputtering method was carried out under deposition conditions of a deposition temperature of 25° C., a gas pressure of 4 mTorr, and a DC power of 0.6 W/cm$^2$, and a deposition rate of 5.6 nanometers/min. thereby depositing an Ru first conductive layer 17 with a thickness of 5 nanometers on the (Ba, Sr)$TiO_3$ high dielectric oxide layer 13.

A third DC sputtering method was carried out under conditions of a deposition temperature of 25° C., a gas pressure of 4 mTorr, and a DC power of 5.2 W/cm$^2$, and a deposition rate of 25 nanometers/min. thereby depositing an Ir second conductive layer 18 with a thickness of 50 nanometers on the Ru first conductive layer 17. As a result, the novel thin film capacitor was completed.

The Ir second conductive layer 18 was deposited at the second deposition rate which is higher than the first deposition rate of the Ru first conductive layer 17 in contact with the (Ba, Sr)$TiO_3$ high dielectric oxide layer 13 so as to shorten the deposition time necessary for forming the top electrode 15, thereby improving the throughput.

Thereafter, the novel thin film capacitor was placed in oxygen and nitrogen gases at a temperature of 350° C. for 30 minutes.

It was confirmed that the first deposition condition for depositing the first conductive layer 17 contributes to suppress the peeling of the top electrode 15 from the (Ba, Sr)$TiO_3$ high dielectric oxide layer 13. This results in improvement in reliability of the thin film capacitor.

The adhesiveness was evaluated by varying the thickness of the first conductive layer 17 in the range of 5–20 nanometers. It was also confirmed that the adhesiveness is improved as the thickness of the first conductive layer 17 is made thin. The thickness of the first conductive layer 17 is not more than 10 nanometers, and preferably about 5 nanometers.

As a comparative embodiment, the conventional thin film capacitor having the single layered Ru top electrode deposited under the same deposition rate as the second conductive layer 18 and at 1.7 W/cm$^2$ was prepared before the conventional thin film capacitor was also placed in oxygen and nitrogen gases at a temperature of 350° C. for 30 minutes.

As the driving voltage applied to the thin film capacitor is over 1.5 V, the conventional thin film capacitor shows the undesirable current leakage characteristics such that the leak current density shows a rapid increase from $1\times10^{-8}$ A/cm$^2$.

When the prior art was applied, then the current leakage characteristics of the conventional thin film capacitor are not good, for example, a leak current density of not less than $1\times10^{-6}$ A/cm$^2$ upon zero driving voltage application to the thin film capacitor. Upon increase in the driving voltage to the thin film capacitor, the thin film capacitor shows a simple increase in the leak current density. In contrast to the conventional thin film capacitor, the novel thin film capacitor with the improved double-layered top electrode shows good current leakage characteristics, for example, a low leak current density of not less than $1\times10^{-8}$ A/cm$^2$ upon zero driving voltage application to the thin film capacitor. Upon increase in the driving voltage from 0 V to about 2 V, the above low leak current density almost remains unchanged. For example, under the application of the driving voltage of 2 V to the novel thin film capacitor, the leak current density remains not less than $1\times10^{-8}$ A/cm$^2$. Namely, the novel thin film capacitor shows the stable and good leak characteristics.

The adhesiveness of the Ru first conductive layer 17 to the (Ba, Sr)$TiO_3$ high dielectric oxide layer 13 was evaluated by varying the thickness of the Ru first conductive layer 17 in the range of 5–20 nanometers. It was confirmed that as the thickness of the Ru first conductive layer 17 is reduced, the adhesiveness of the Ru first conductive layer 17 to the (Ba, Sr)$TiO_3$ high dielectric oxide layer 13 is improved. For example, a preferable thickness range of the Ru first conductive layer 17 is not thicker than 10 nanometers. In contrast, the thin film capacitor shows the good current leakage characteristics such that the leak current density remains suppressed at not higher then $1\times10^{-8}$ A/cm$^2$ under applications to the target with the driving voltage in the range of 0 V to 3 V.

Since the first conductive layer 17 deposited at the low deposition rate is thin, it is possible to shorten the necessary time for depositing the top electrode for improvement in throughput of the thin film capacitor.

As a modification to the above, the first conductive layer 17 was deposited by an evaporation method. The thin film capacitor was then subjected to the evaluations in the leak current characteristics and adhesiveness. It was confirmed that the thin film capacitor shows the good leak current characteristics and high adhesiveness.

As a further modification to the above, the first conductive layer 17 was deposited by a chemical vapor deposition method. The thin film capacitor was then subjected to the evaluations in the leak current characteristics and adhesiveness. It was confirmed that the thin film capacitor shows the good leak current characteristics and high adhesiveness.

The above improved top electrode structure allows the thin film capacitor to have good leak current characteristics with high throughput and high yield conditions.

Available sputtering systems for depositing the electrodes of the novel thin film capacitor are not limited to a specific one. The sputtering system 20 has a vacuum chamber 2 which accommodates a substrate holder 3 on which substrates 4 are mounted for forming a novel thin film capacitor. The vacuum chamber 2 also accommodates a high frequency electrode plate 5 with a sputter target 6 which faces to the substrates 4 on the substrate holder 3 and is distanced from the substrates 4 on the substrate holder 3. It is of course possible to provide the high frequency electrode plate 5 with plural different sputter targets 6. It is alternatively possible to provide a plurality of the high frequency electrode plate 5 so that different targets 6 are provided on the plural high frequency electrode plates 5. A shutter 7 may optionally be provided between the substrate holder 3 and the high frequency electrode plate 5. An inert gas supplier 21 is further provided for supplying an inert gas into the vacuum chamber 2. A vacuum pump 22 is also provided for causing a vacuum of the vacuum chamber 2. A high frequency power supply 10 and a power controller 9 are provided for supplying a high frequency power through the power controller 9 to the high frequency electrode plate 5 under control of the power, whereby the power controller 9 controls the power to be applied to the target 6 on the high frequency electrode plate 5. Since the deposition rate depends on a voltage corresponding to the power to be applied to the target 6, then the power controller 9 controls the deposition rate. A control unit 8 is further provided which is connected to both the vacuum pump 22 and the power controller 9 for controlling the deposition time of sputtering process and a degree of the vacuum in the vacuum chamber 2.

The above novel thin film capacitor with the improved double-layered top electrode structure possesses the following advantages and effects.

First, the above novel thin film capacitor has the good electric characteristics. The material of the first conductive layer in contact with the high dielectric oxide layer is deposited at a low deposition rate under a low deposition power to prevent reaction on the interface between the first conductive layer and the high dielectric oxide layer or prevent the top surface of the high dielectric oxide layer from receiving any substantive damage.

Second, the top electrode structure makes it possible to shorten the time for deposition of the top electrode for improvement in throughput of the thin film capacitor. The first conductive layer is deposited at a sufficiently low deposition rate for prevent the top surface of the high dielectric oxide layer from receiving any substantive damage, whilst the second conductive layer is deposited at a sufficiently high deposition rate for shortening a total time for depositions of the first and second conductive layers.

Third, the first conductive layer intervening between the second conductive layer and the high dielectric oxide layer prevents peeling of the top electrode from the high dielectric oxide layer for improvement in the yield of the thin film capacitor.

Fourth, the material of the first and second conductive layers are so selected as to have a high formability to a reactive ion etching. The improvement in formability of the top electrode allows a further scaling down of the thin film capacitor with a highly accurate dimension, whereby a further increase in the degree of integration of the semiconductor devices can be realized.

The following descriptions will focus on possible modification to the above present invention. In this embodiment, the bottom electrode is made of $RuO_2$. Nothwithstanding, conductive materials are available for the bottom electrode, which are capable of keeping conductivity in an oxygen atmosphere during the process for formation of the high dielectric oxide layer on the bottom electrode. For example, there are available for the bottom electrode material Ru, Ir, Re, Os, Rh, and oxides thereof as well as at least any one selected from the group of silicide compounds in addition at least any one selected from the group of Pt, Au, Ag, Pd, Ni, Co and alloys thereof.

Further, the bottom electrode may be modified to have multi-layer structure.

In place of (Ba, Sr)$TiO_3$, materials represented by a chemical formula $ABO_3$ are available for the high dielectric oxide layer, wherein A may comprise at least any one selected from the group consisting of Ba, Sr, Pb, Ca, La, Li and K, and B may comprise at least any one selected from the group consisting of Ti, Zr, Ta, Nb, Mg, Fe, Zn and W. For example, there are available $SrTiO_3$, (Sr, Ca)$TiO_3$, (Ba, Sr, Ca)$TiO_3$, $PbTiO_3$, $Pb(Zr, Ti)O_3$, (Pb, La)(Zr, Ti)$O_3$, $Pb(Mg, Nb)O_3$, $Pb(Mg, W)O_3$, $Pb(Zn, Nb)O_3$ $LiTaO_3$, $LiNbO_3$, $KTaO_3$, $KTaO_3$, and $KNbO_3$. Further, there are available materials represented by the chemical formula $(Bi_2O_2)(A_{m-1}B_mO_{3m+1})$ (m=1, 2, 3, 4, 5), wherein A may comprise at least any one selected from the group consisting of Ba, Sr, Pb, Ca, K and Bi, and B may comprise at least any one selected from the group consisting of Nb, Ta, Ti, and W. For example, $Ba_4Ti_3O_{12}$, $SrBa_2Ta_2O_9$, and $SrBa_2Nb_2O_9$ are also available. In addition, $Ta_2O_5$ is further available which has a chemical composition different from those of the above chemical formula.

The above high dielectric oxide layer may be modified to have a multi-layered structure.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a top electrode on a high dielectric oxide layer of a thin film capacitor, said method comprising the steps of:

carrying out a deposition of a conductive material having a formability to a reactive ion etching under a first deposition condition of a first deposition rate to deposit a first conductive layer on said high dielectric oxide layer; and continuing said deposition the same conductive material under a second deposition condition of a second deposition rate which is higher than said first deposition rate to deposit a second conductive layer on said first conductive layer, wherein said first deposition rate is sufficiently low to prevent causing any substantive damage to a top surface of said high dielectric oxide layer and said second deposition rate is sufficiently high to shorten deposition time and to cause damage to said high dielectric oxide layer if said second conductive layer were deposited on the top surface of said high dielectric oxide layer, wherein an interface between said first conductive layer and said high dielectric oxide layer is such that a density of a leak current across said interface is suppressed at not higher than $1 \times 10^{-8}$ A/cm$^2$ upon applying a voltage of 2 V across said dielectric oxide layer after said multi-layer structure has been subjected to a heat treatment at 350° C.

2. The method as claimed in claim 1, wherein said first conductive layer is deposited at said first deposition rate by a first sputtering process with applying a target with a first power and then said second conductive layer is deposited at said second deposition rate by a second sputtering process with applying said target with a second power which is higher than said first power.

3. The method as claimed in claim 2, wherein said first power is less than 1.7 W/cm$^2$, and said second power is more than 1.7 W/cm$^2$.

4. The method as claimed in claim 1, wherein said first and second conductive layers are deposited by a chemical vapor deposition process under a first deposition condition and a second deposition condition.

5. The method as claimed in claim 1, wherein said first and second conductive layers are deposited by an evaporation process under a first deposition condition and a second deposition condition.

6. The method as claimed in claim 1, wherein said conductive material includes at least any one of Ru, $RuO_2$, Ir, $IrO_2$, and combinations or mixtures thereof.

7. The method as claimed in claim 1, wherein said first conductive layer has a thickness of about one-tenth of a thickness of said second conductive layer.

8. A method of forming a top electrode on a high dielectric oxide layer of a thin film capacitor, said method comprising the steps of:

carrying out a first deposition of a first conductive material having a formability to a reactive ion etching under a first deposition condition of a first deposition rate to deposit a first conductive layer on said high dielectric oxide layer; and carrying out a second deposition of a second conductive material having a formability to said reactive ion etching under a second deposition condition of a second deposition rate which is higher than said first deposition rate to deposit a second conductive layer on said first conductive layer, wherein said first deposition rate is sufficiently low to prevent causing any substantive damage to a top surface of said high dielectric oxide layer and said second deposition rate is sufficiently high to shorten deposition time and to cause damage to said high dielectric oxide layer if said second conductive layer were deposited on the top surface of said high dielectric oxide layer, wherein an interface between said first conductive layer and said high dielectric oxide layer is such that a density of a leak current across said interface is suppressed at not higher than $1 \times 10^{-8}$ $A/cm^2$ upon applying a voltage of 2 V across said dielectric oxide layer after said multi-layer structure has been subjected to a heat treatment at 350° C.

9. The method as claimed in claim 8, wherein said first conductive layer is deposited at said first deposition rate by a first sputtering process with applying a target with a first power and then said second conductive layer is deposited at said second deposition rate by a second sputtering process with applying said target with a second power which is higher than said first power.

10. The methods as claimed in claim 9, wherein said first power is less than 1.7 $W/cm^2$, and said second power is more that 1.7 $W/cm^2$.

11. The method as claimed in claim 8, wherein said first and second conductive layers are deposited by a chemical vapor deposition process under a first deposition condition and a second deposition condition.

12. The method as claimed in claim 8, wherein said first and second conductive layers are deposited by an evaporation process under a first deposition condition and a second deposition condition.

13. The method as claimed in claim 8, wherein said conductive material includes at least any one of Ru, $RuO_2$, Ir, $IrO_2$, and combinations or mixtures thereof.

14. The method as claimed in claim 8, wherein said first conductive layer has a thickness of about one-tenth of a thickness of said second conductive layer.

* * * * *